United States Patent [19]

Dressler

[11] Patent Number: 4,615,760
[45] Date of Patent: Oct. 7, 1986

[54] SUPPRESSION OR CONTROL OF LIQUID CONVECTION IN FLOAT ZONES IN A ZERO-GRAVITY ENVIRONMENT BY VISCOUS GAS SHEAR

[76] Inventor: Robert F. Dressler, 8110 Springfield Rd., Glenn Dale, Md. 20769

[21] Appl. No.: 696,874

[22] Filed: Jan. 10, 1985

Related U.S. Application Data

[63] Continuation of Ser. No. 457,541, Jan. 12, 1983, abandoned.

[51] Int. Cl.$^4$ .............................................. C30B 13/02
[52] U.S. Cl. ........................... 156/620; 156/DIG. 62; 156/DIG. 88; 156/DIG. 89; 75/652 M
[58] Field of Search ....... 156/620, DIG. 88, DIG. 89, 156/DIG. 62; 75/652 M; 65/111; 422/250

[56] References Cited

U.S. PATENT DOCUMENTS

| | | | |
|---|---|---|---|
| B 431,785 | 2/1976 | Nagorsen | 156/DIG. 62 |
| 3,086,856 | 4/1963 | Siebertz | 75/10 |
| 3,623,905 | 11/1971 | Shinichi Akai et al. | 156/619 |
| 3,799,836 | 3/1974 | Rogers et al. | 65/111 |
| 3,976,536 | 8/1976 | Keller | 156/620 |
| 4,046,617 | 9/1977 | Fletcher et al. | 156/601 |
| 4,078,951 | 3/1978 | Denzine et al. | 75/82 |

FOREIGN PATENT DOCUMENTS 2823891  12/1979  Fed. Rep. of Germany ...... 156/620

OTHER PUBLICATIONS

L. E. Scriven et al., The Marangoni Effects, Nature, Jul. 16, 1960, vol. 187, pp. 186–187.
Carruthers et al., Studies of Floating Liquid Zones In Simulated Zero Gravity, Applied Physics, Feb. 1972, vol. 43, No. 2 pp. 436–445.
H. Rodot et al., Crystal Growth Method Under Microgravity Conditions, Journal of Crystal Growth 52, 1981, pp. 478–484.

*Primary Examiner*—David L. Lacey
*Attorney, Agent, or Firm*—Sughrue, Mion, Zinn, Macpeak, and Seas

[57] ABSTRACT

In the float-zone processing of materials in a zero-gravity environment, such as outer space or in orbital flight, the Marangoni flow at the free surface of the float zone is stopped by directing streams of heated, non-reactive gas(es) tangentially to the surface and in a direction and with a velocity such that counterbalancing shear forces are produced. The total resultant shear forces at the surface are therefore zero, and all Marangoni convection throughout the float zone is virtually eliminated. Alternatively, changes in the gas streams can produce any specified non-zero convection velocity in a critical region when desired. Also useful and beneficial in reducing or controlling or modifying the resultant velocity of the combined convections for float-zone processes carried out on earth. Particularly useful in the growing of improved doped semiconductor crystals, and also useful in improving the controlled solidification in float zones for the fabrication of improved glasses and metal alloys in zero gravity or on earth.

11 Claims, 2 Drawing Figures

SUPPRESSION OR CONTROL OF LIQUID CONVECTION IN FLOAT ZONES IN A ZERO-GRAVITY ENVIRONMENT BY VISCOUS GAS SHEAR

This is a continuation of application Ser. No. 457,541 filed Jan. 12, 1983 now abandoned.

BACKGROUND OF THE INVENTION

1. Field of the Invention

My invention relates generally to the field of the float-zone fabrication of semiconductors and to the controlled solidification of other solids, such as alloys and glasses, in float zones and, more particularly, to a method and apparatus for suppressing or controlling the various convections in the float-zone which are induced by various causes, for example, the socalled Marangoni convection driven by the shear forces at the free surface and which are induced by the variation of surface tension in the free surface of the float zone due to the variation in temperature there, and also sometimes due to another substance, called a surfactant, present at the free surface in varying concentration.

2. Description of the Prior Art

In float-zone processing on earth where there is a gravitational force of 1 g, there may be three flows or convections which occur in the float zone: Thermal convection, solutal convection, and Marangoni convection; these convections combine to produce a resultant convection. On earth, the dominant component of convection is often, but not always, the thermal convection which is sometimes much larger than the Marangoni convection. However, in a near zero-gravity environment, such as in outer space or in orbital flight, the thermal and solutal convections are virtually eliminated, leaving only the Marangoni convection which is produced by the surface-tension gradient. Since conducting float-zone processes in space-flight is very expensive, such can be justified only if the material produced in the zero-gravity environment is far superior to that produced on earth. Consequently, in space-flight, it becomes important to eliminate, or to control to a specified level, the Marangoni convection which is relatively less important on earth, thereby, in the case of growing doped silicon crystals, for example, producing uniform distribution on a microscopic scale of the dopant to produce corresponding uniform resistivity on a microscopic scale, or to produce desired energy states, providing more stable and uniform growth of the resolidification interface, and producing crystals which are larger with better quality. In the case of other materials, such as alloys and glasses, the zero-gravity environment will produce better alignment of the microstructure in alloys, such as the super alloys used in turbine blades, and/or better uniformity of the microstructure, e.g. more uniform solution of one component in the other, thereby providing better mechanical, optical and/or electromagnetic properties in alloys, glasses etc. In some applications it is most desirable to eliminate the convection. In certain other cases, it may be preferable to control the convection to a specified optimal level in a particular region, as, for example, to inhibit dendrite growth on the resolidification surface. This invention applies to both cases.

There have been discussed in the literature the thermal, solutal, and Marangoni convections occurring in float zones and also, specifically, the Marangoni convection occurring in a zero gravity environment. (See "The Marangoni Effects", Scriven et al, Nature, July 16, 1960, Volume 187, pages 186–187 and "Studies of Floating Liquid Zones in Simulated Zero Gravity", Carruthers et al; Applied Physics, February, 1972, Volume 43, No. 2, pages 436–445). Furthermore, U.S. Pat. No. 4,046,617 discloses a method of refining or growing bulk single crystals in a zero gravity environment, but does not recognize or solve the problem of Marangoni convection. U.S. Pat. No. 3,086,856 discloses a float-zone process on earth utilizing a magnetic field or streams of gas to support the float zone against the gravitational force on earth. No mention is made of the fluid convections. U.S. Pat. No. 3,976,536 discloses a float-zone process conducted on earth and employing a gas stream for purposely inducing more rapid motion and turbulence in the float zone, allegedly to obtain constant dopant distribution in a semiconductor to produce constant resistivity on a macroscopic scale; recent research, however, indicates that uniform resistivities on the desired microscopic scale are best obtained by relying only on diffusion with as little convection as possible within the float zone. Furthermore, the increased convection will produce crystals with more imperfections.

SUMMARY OF THE INVENTION

Therefore, a specific object of my invention is to provide a process and apparatus for suppressing and virtually eliminating, or controlling to a specified optimal level, the Marangoni convection in float zones in a zero-gravity environment, in particular, in space-flight.

A more general object of my invention is to reduce substantially, and/or to control at, or substantially nearer to, a specified optimal level the resultant convection in a float zone on earth where the components of the resultant convection are thermal, solutal (sometimes), and Marangoni convection.

Another object of my invention is to suppress or to control the Marangoni convection in a float zone in a zero-gravity environment by directing non-reactive gas streams tangentially or with some inclination along the free surface of the float zone, the velocity and direction of the gas being chosen either to cancel out the liquid velocity at the surface, or to change it to a specified level.

Still another object of my invention is to heat the gas streams independently to temperatures within the temperature range found at the free surface of the float zone, thereby flattening the temperature profile of the float zone free surface and further reducing the Marangoni convection, since a part of the variation in surface tension is caused by the variation in temperature of the free surface.

Another object of my invention is to flatten the resolidification interface, when desired, by the heated gas jet near the resolidification surface as the jet travels along the outside solid rim or cusp of the resolidification surface at a temperature above the melting point of the solid. The heated gas jet in this way melts the solid rim or cusp, thus serving as a supplementary "tickler" heater while it is simultaneously suppressing or controlling the convection.

In one embodiment of the invention, gas nozzles are placed around the float zone and oriented to direct a gas stream tangentially along the zone's free surface in a direction and with a velocity chosen to suppress or to control the convection within the zone.

DETAILED DESCRIPTION OF THE PREFERRED EMBODIMENTS

One of the principal advantages of float-zone processing materials in a zero gravity environment, such as in space-flight, is the virtual elimination of thermal and solutal convections in such applications as the growing and purification of crystals and the fabrication of better doped-semiconductors, alloys and glasses. For example, with a semiconductor such as silicon the float-zone process conducted in zero gravity will produce crystals which are more free from defects and which have a more uniform distribution of dopant on a microscopic scale. Furthermore, better alloys, such as the superalloys, can be obtained from float-zoning in zero gravity because convection in the molten material is reduced. In the cases where the molten materials, such as silicon, are extremely corrosive, no other satisfactory solid material used as a wall can be placed into contact with the molten zone to eliminate the free surface which produces Marangoni convection. As is well known, the temperature gradient and the surfactant concentration gradient at the free surface of the liquid in the float zone create a surface-tension gradient which produces on the free surface shear stresses which excite a movement of the liquid along its surface. Then, by viscous action, movement below the surface is induced, thereby giving rise to the flow called Marangoni convection throughout the liquid.

Figure 1:
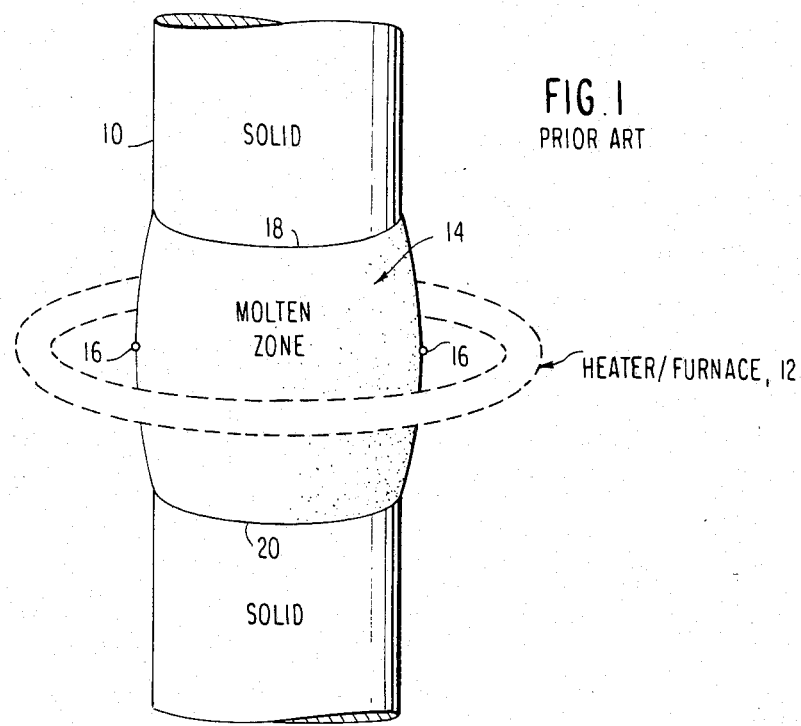
FIG. 1 schematically illustrates a conventional float zone process and shows the float zone surrounded by a toroidal heating means for melting the zone.

FIG. 1 schematically illustrates a conventional float-zone process and apparatus. A solid bar or rod 10 of material is suspended so that its longitudinal axis is vertical when processing on earth. A toroidal heating means 12, of small axial height relative to the length of the rod, encircles the rod and melts a zone of the rod to produce the molten float zone 14. As is conventional, the rod is moved downwardly so that the float zone 14 moves upwardly through the rod. The heating means 12 may be, for example, an electrically heated element or a circle of furnace lamps. The temperature of the liquid surface of the float zone is highest in the central region 16 and decreases to the material's melting temperature at the melting interface 18 and at the re-solidification interface 20.

Figure 2:
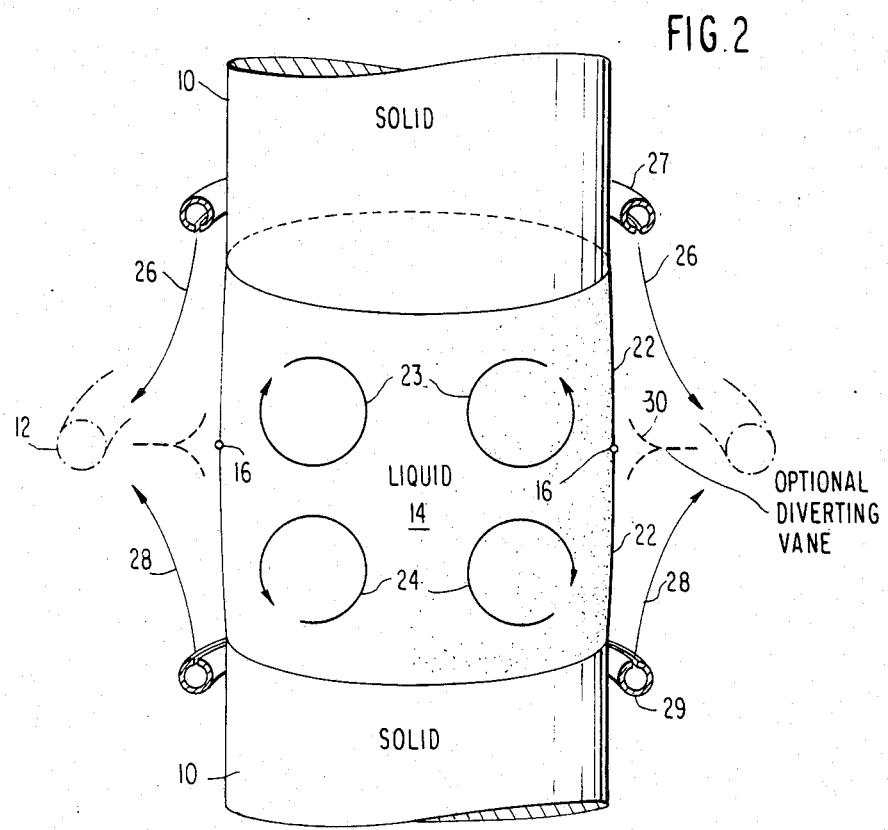
FIG. 2 schematically illustrates both the Marangoni convection (before it is suppressed) in a float zone at zero gravity and also a preferred embodiment of the invention for suppressing or controlling the Marangoni convection.

FIG. 2 schematically illustrates the Marangoni convection when occurring alone in the float zone without the controlling action of the gas jets, and also illustrates a preferred embodiment of my improved process and apparatus. When the float zone process is carried out in a zero-gravity environment, such as in space-flight, thermal and solutal convections are eliminated, leaving only Marangoni convection which, in such an environment, now becomes significant and must be eliminated or suppressed to an optimal level in order to obtain, in the case of semiconductor crystal growing, uniformly doped crystals of large size with high quality. The Marangoni effect or surface variation acting on the free surface 22 of the float zone 14 in the absence of the controlling gas jets sets up two rotationally-symmetric convection cells, each a torus, such as cells 23 and 24 illustrated in FIG. 2, thereby producing in the liquid a relatively rapid flow which is, unfortunately, not reduced in a zero-gravity environment. It is, therefore, an object of my invention to provide a method and apparatus which will virtually eliminate, or reduce to any specified optimal level, this Marangoni convection in zero gravity.

As shown in FIG. 2, the Marangoni convection at the free surface in the upper half of the float zone is directed upwardly, and in the lower half it is directed downwardly. Thus, in accordance with my invention, a ring-shaped heated stream or jet 26 of non-reactive or inert gas(es), such as argon, is blown downwardly from the unmelted top of the solid bar 10 via a toroidal gas manifold or nozzle assembly 27, for example, and a corresponding stream or jet 28 is blown upwardly from the lower resolidified end of the solid bar by a corresponding assembly 29 to suppress or control to a specified level the Marangoni convection in a zero or low gravity environment (where thermal and solutal convection are virtually absent). Of course, both gas jets may emanate from the same source and be appropriately directed by suitable conduits. If the two ring-shaped jets 26 and 28 are properly balanced, the gas streamlines will be diverted radially outward as they meet in the region of the midpoint 16 of the float zone 14. Optionally, a circular diverting vane 30 may be placed around the central region of a float zone, without touching the zone, in order to improve the radially outward diverting of the two gas jets.

The required velocity of the two gas jets 26 and 28 for elimination of the convection in zero gravity may be determined by observing at what gas velocity the Marangoni convection at the free surface is canceled out. This gas velocity may also be mathematically calculated. For example, for a liquid gallium zone having a height of 6.8 cm with a temperature differential of 50° C. between the highest temperature at the midpoint of the float zone and the lowest temperature at the interfaces, I calculated the total shear force which excites the Marangoni convection over each half of the zone per unit width to be 0.65 dynes/cm. Using the laminar boundary-layer drag theory, I calculated the velocity of each argon jet stream required to balance out this shear force to be 1.1 meter/second. Using the turbulent boundary-layer theory, I calculated the required gas velocity to be 1.3 meters/second. In either case, the required gas velocity is less than two meter/second which is a feasible value for a float-zone processing device located in a space shuttle. In general, the direction and velocity of the gas jet are chosen so that the total shear force produced by the gas jet balances out the total shear force which is created by the surface-tension gradient and which drives the Marangoni convection. I chose gallium in this calculation because it is closely related to silicon, and the behavior of surface tension with the temperature for molten silicon has not yet been accurately measured.

As already pointed out, the temperature at the midpoint of the float zone is higher than that at both of the solid interfaces at the opposite ends of the float zone. It is clear that my invention will suppress the Marangoni convection by means of the opposing shear forces created by the gas jets, independently of altering this temperature profile. Typically, the temperature at the midpoint of the float zone may be approximately 50° C.

higher than that at the two opposite ends of the zone. However, by heating the gas jets to a temperature within the temperature range of the liquid surface in the float zone, the temperature profile will be flattened, thereby also flattening the surface tension profile to contribute to the reduction or suppression of the Marangoni convection.

While, in the preferred embodiment of my invention, I direct the gas jets along the entire free surface of the float zone, the critical region with respect to convection may be the region immediately adjacent to the lower re-solidification interface. Therefore, in another embodiment of my invention, the gas jets may be directed only tangentially to the liquid surface at the lower area adjacent to the re-solidification interface. In another variation of the preferred embodiment of the invention, several different gas jets, at different angles and/or different temperatures, can be used to keep the jets tangent to the entire curved free surface of the float zone and to provide for independent temperature control. Such a variation is desirable if, for example, because of deficiencies or asymmetries in the heating means for melting the zone, the temperature at the float zone surface is not constant around any circumference; in this case, the separate gas jets may be individually adjusted in velocity and/or temperature to suppress Marangoni convection most effectively in each local region. Each gas jet or stream is produced by a ring-like or toroidal gas manifold containing nozzles or orifices in the form of either a continuous slit around the circumference of the manifold or else a plurality of separate orifices.

In certain applications when it is desirable to control the convection in a specific region (such as the region adjacent to the re-solidification surface) to a specified non-zero optimal level, rather than to eliminate all convection totally, this can also be done as follows: An initial computer calculation based upon the actual parameters in the problem will determine what the free-surface velocity must be in order to produce the desired velocity in the critical region inside the float zone. Then the gas jet velocities and/or temperatures can be varied until this calculated surface velocity is attained. The surface velocities can be measured by any conventional means such as a laser Doppler velocimeter, although the velocities within an opaque fluid are usually most readily obtained by calculation, rather than by measurement.

Even though my invention is most effective with Marangoni flow for float zone processing carried out in a zero-gravity environment, such as in orbital or spaceflight, it is also effective and beneficial for use on earth where there is a resultant convection produced by the combination of all three convections: thermal, solutal, and Marangoni. Depending upon the specific values of all the parameters, and because of asymmetries in the device, the initial convection pattern on earth may be either one-looped or several-looped, rather than the two-looped pattern in FIG. 2, and may not necessarily be rotationally symmetric. If so, one or several jet systems need be employed, depending upon the directions of the observed surface velocities. Again, this resultant convection in the free surface of the float zone can be observed and firstly balanced out over the free surface by the opposing shear forces produced by gas jet systems, each directed with the appropriate velocity and direction which on earth may not be axial but, instead, inclined from the axis. This step will reduce the interior convection since it is equivalent to replacing the free surface by a solid wall boundary. Next, computer calculations can determine what oppositely directed liquid surface velocities are needed in order to further reduce and to minimize the internal convection in a critical region, or to approach as closely as possible to any specified optimal velocity there. Further increase in the gas jet velocities is then made to attain these computed oppositely directed surface velocities. Alternatively, these optimal surface velocities can be determined experimentally, without a computer, by conducting a sequence of experiments for different imposed surface velocities until the best result from the processing is obtained. For these applications on the ground (unlike the applications in zero gravity), my method will not always necessarily produce zero convection, or will not always necessarily reach a specified non-zero level, because the gas jet produces a surface excitation, whereas thermal and solutal convections are excited by bulk forces throughout the volume. Nevertheless, my invention in either case will provide a substantial improvement of float-zone processing on earth as compared with the uncontrolled convection existing with the current state of the art.

Furthermore, the re-solidification interface tends to have an outer circumferential solid rim or cusp which produces a cup-shaped interface. If it is desired to reduce this solid rim, the lower gas jet can be heated to a temperature high enough to melt or partially melt the rim, thereby making the re-solidification interface flatter.

When Marangoni convection occurs alone in zero gravity, or dominates the resultant convection on earth, the entire flow pattern may eventually become unstable, as is well known, and develop a reciprocating and tilting oscillation in the circumferential direction. This requires parameters in the float-zone process to become so large that the high "critical" Marangoni number is reached, but this may never occur in many applications, However, if it does occur, my method will still suppress or control the convection, because the gas jets remain effective in lowering the axial components of the fluid velocity, which in turn will thereby lower the Marangoni number to a value below "critical", and then the oscillations will cease.

An important application of my invention is in the float-zone fabrication of semiconductor crystals such as silicon, indium phosphide, indium arsenide, gallium arsenide, etc. In this case, a dopant is added either to the solid bar or to the liquid float zone in order to produce the desired level of electrical conductivity or the desired energy states. The dopant should be very uniformly distributed throughout the material when averaged over microscopic intervals, and this distribution should be obtained without causing many crystal defects or decreasing the size of the crystals as will occur when the liquid in the melt zone is vigorously agitated as proposed in U.S. Pat. No. 3,976,536.

In a typical case of making silicon crystals by the floatzone process including my invention for suppressing the Marangoni convection in a zero gravity environment, the liquid melt zone might have a height of 30 mm, a maximum diameter of 30 mm, a maximum temperature (at the midpoint of the zone) of 1500° C., and a melting or solidification temperature at the upper and lower interfaces of 1420° C.

In addition to the importance of my invention in the field of growing better doped semiconductor crystals, it also is useful and beneficial in the float-zone processing of glasses and metal alloys in low gravity or on earth.

While I have disclosed my invention in the form of various preferred embodiments, it is clear that other obvious variations and embodiments will become clear to those skilled in the relevant art; thus, the scope of my invention is limited only by the following claims.

I claim:

1. In a process of zone melting and resolidifying a rod of fusible material wherein a molten float zone is translated axially along the rod, said float zone having a free surface, a resolidification and a melting interface at respective axially opposite ends of the zone, and a midpoint on said surface intermediate the interfaces, the improvement which comprises the steps of carrying out the process in a zero-gravity environment where the only induced convections are Marangoni convections produced by the Marangoni effect, and directing substantially tangentially along the free surface of the float zone an annular stream of non-reactive viscous gas in directions opposite to resultant Marangoni convections at the surface, said stream having a velocity so as to produce viscous shear stresses of the proper magnitude on said surface to suppress or control resultant Marangoni convections within the molten float zone, said free surface being substantially straight in said zero-gravity environment.

2. The process as defined in claim 1 further comprising directing the stream of gas in a direction from the resolidification interface of the float zone toward the midpoint of the float zone.

3. The process as defined in claim 2 wherein said stream is also directed in a direction from the melting interface toward the midpoint of the float zone.

4. The process as defined in claim 1 wherein the temperature at the midpoint of the free surface of the float zone is higher than that at the opposite axial ends thereof, and wherein the gas is heated to a temperature within the temperature range of the free surface of the float zone.

5. The process as defined in claim 4 wherein said surface is in the form of a cylinder, and wherein two annular streams of said gas are directed from opposite ends of said cylinder and are diverted radially outwardly at said midpoint.

6. The process as defined in claim 1 wherein the material is a glass.

7. The process as defined in claim 1 wherein the material is an alloy.

8. The process as defined in claim 1 wherein the material is a semiconductor.

9. The process as defined in claim 8 wherein the semiconductor is selected from the group consisting of silicon, indium phosphide, and gallium arsenide.

10. The process as defined in claim 1 wherein the gas is argon.

11. The process as defined in claim 1 wherein the material is a crystalline substance.

* * * * *